(12) United States Patent
Chen et al.

(10) Patent No.: US 11,469,365 B2
(45) Date of Patent: Oct. 11, 2022

(54) SENSING FILM AND METHOD OF MAKING SAME AND ELECTRONIC DEVICE USING SENSING FILM

(71) Applicants: Interface Technology (ChengDu) Co., Ltd., Chengdu (CN); INTERFACE OPTOELECTRONICS (SHENZHEN) CO., LTD., Shenzhen (CN); GENERAL INTERFACE SOLUTION LIMITED, Zhunan (TW)

(72) Inventors: Yu-Ju Chen, Zhunan (TW); Chien-Chih Hsu, Zhunan (TW)

(73) Assignees: Interface Technology (ChengDu) Co., Ltd., Chengdu (CN); INTERFACE OPTOELECTRONICS (SHENZHEN) CO., LTD., Shenzhen (CN); GENERAL INTERFACE SOLUTION LIMITED, Zhunan (TW)

( * ) Notice: Subject to any disclaimer, the term of this patent is extended or adjusted under 35 U.S.C. 154(b) by 928 days.

(21) Appl. No.: 16/258,951

(22) Filed: Jan. 28, 2019

(65) Prior Publication Data
US 2020/0119256 A1 Apr. 16, 2020

(30) Foreign Application Priority Data
Oct. 10, 2018 (CN) .......................... 201811177948.9

(51) Int. Cl.
*H01L 41/193* (2006.01)
*H01L 41/047* (2006.01)
(Continued)

(52) U.S. Cl.
CPC .......... *H01L 41/193* (2013.01); *H01L 41/047* (2013.01); *H01L 41/1132* (2013.01);
(Continued)

(58) Field of Classification Search
CPC . H01L 41/193; H01L 41/047; H01L 41/1132; H01L 41/45; H01L 51/442
See application file for complete search history.

(56) References Cited

U.S. PATENT DOCUMENTS

2015/0177078 A1* 6/2015 Dumitru ................. H01L 27/20
73/777
2016/0064456 A1* 3/2016 Lee .................... H01L 27/14645
257/432
(Continued)

*Primary Examiner* — Bryan P Gordon
(74) *Attorney, Agent, or Firm* — ScienBiziP, P.C.

(57) ABSTRACT

A sensing film includes a base layer, a piezoelectric layer formed on the base layer, and a first electrode and a second electrode formed on the piezoelectric layer. The first and second electrodes are spaced apart and electrically insulated from each other. The first electrode includes a first connecting portion and a number of first extending portions coupled to the first connecting portion. The second electrode includes a second connecting portion and a number of second extending portions coupled to the second connecting portion. The first connecting portion and the second connecting portion are spaced apart and face each other. The first extending portions extend from a side of the first connecting portion toward the second connecting portion. The second extending portions extend from a side of the second connecting portion toward the first connecting portion. The first extending portions and the second extending portions are alternately arranged.

7 Claims, 8 Drawing Sheets

(51) Int. Cl.
*H01L 41/113* (2006.01)
*H01L 41/45* (2013.01)
*G01L 1/16* (2006.01)
*H01L 51/44* (2006.01)

(52) U.S. Cl.
CPC ............... *H01L 41/45* (2013.01); *G01L 1/16* (2013.01); *H01L 51/442* (2013.01)

(56) References Cited

U.S. PATENT DOCUMENTS

| | | | |
|---|---|---|---|
| 2016/0087233 A1* | 3/2016 | Guha | H01L 51/4293 438/82 |
| 2016/0181952 A1* | 6/2016 | Kim | H02S 10/10 310/319 |
| 2017/0125172 A1* | 5/2017 | Gong | H01L 51/0047 |

\* cited by examiner

SENSING FILM AND METHOD OF MAKING SAME AND ELECTRONIC DEVICE USING SENSING FILM

FIELD

The subject matter herein generally relates to electronic devices, and more particularly to an electronic device having a sensing film.

BACKGROUND

Generally, a method for making a sensing film includes coating a surface of a piezoelectric ceramic sheet with an electrode, and bonding the piezoelectric ceramic sheet coated with an electrode to a printed circuit board (PCB). This process requires an anisotropic conductive film (ACF) to be placed between the piezoelectric ceramic sheet and the PCB, and pressure is applied to press the two together. If the main component of the ceramic sheet is a polycrystalline sintered body having crystal grains and grain boundaries, the grain boundary is susceptible to stress concentration during the pressing process, which may cause the ceramic sheet to break. In addition, most ceramic sheets currently used in the industry are cast, and if a film is to be formed, a large amount of a binder is required. Therefore, in a subsequent sintering process, gas escaping from the ceramic causes micropores to form in the ceramic sheets, which in turn greatly reduces a mechanical strength of the ceramic sheets.

BRIEF DESCRIPTION OF THE DRAWINGS

Implementations of the present disclosure will now be described, by way of embodiments only, with reference to the attached figures.

DETAILED DESCRIPTION

Figure 1:
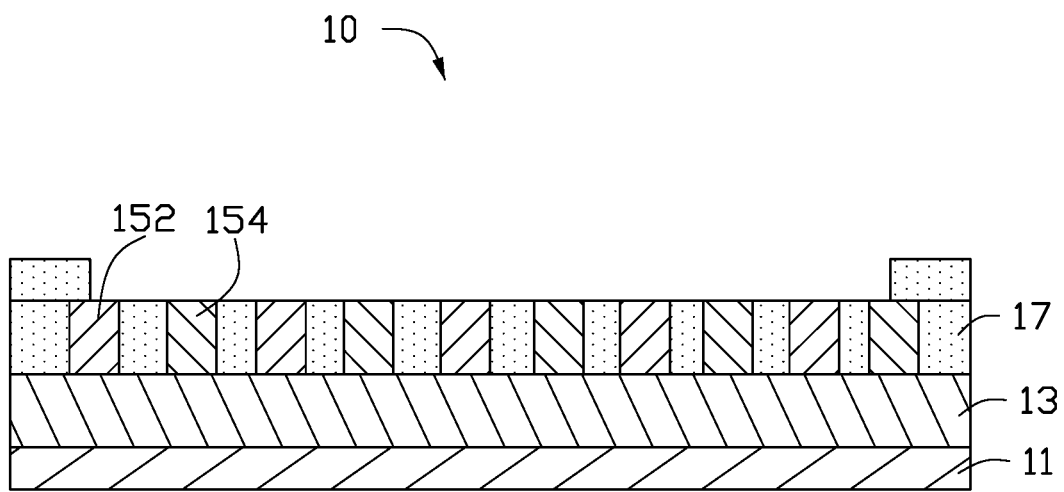
FIG. 1 is a schematic cross-sectional view showing a sensing film according to a first embodiment.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

Figure 2:
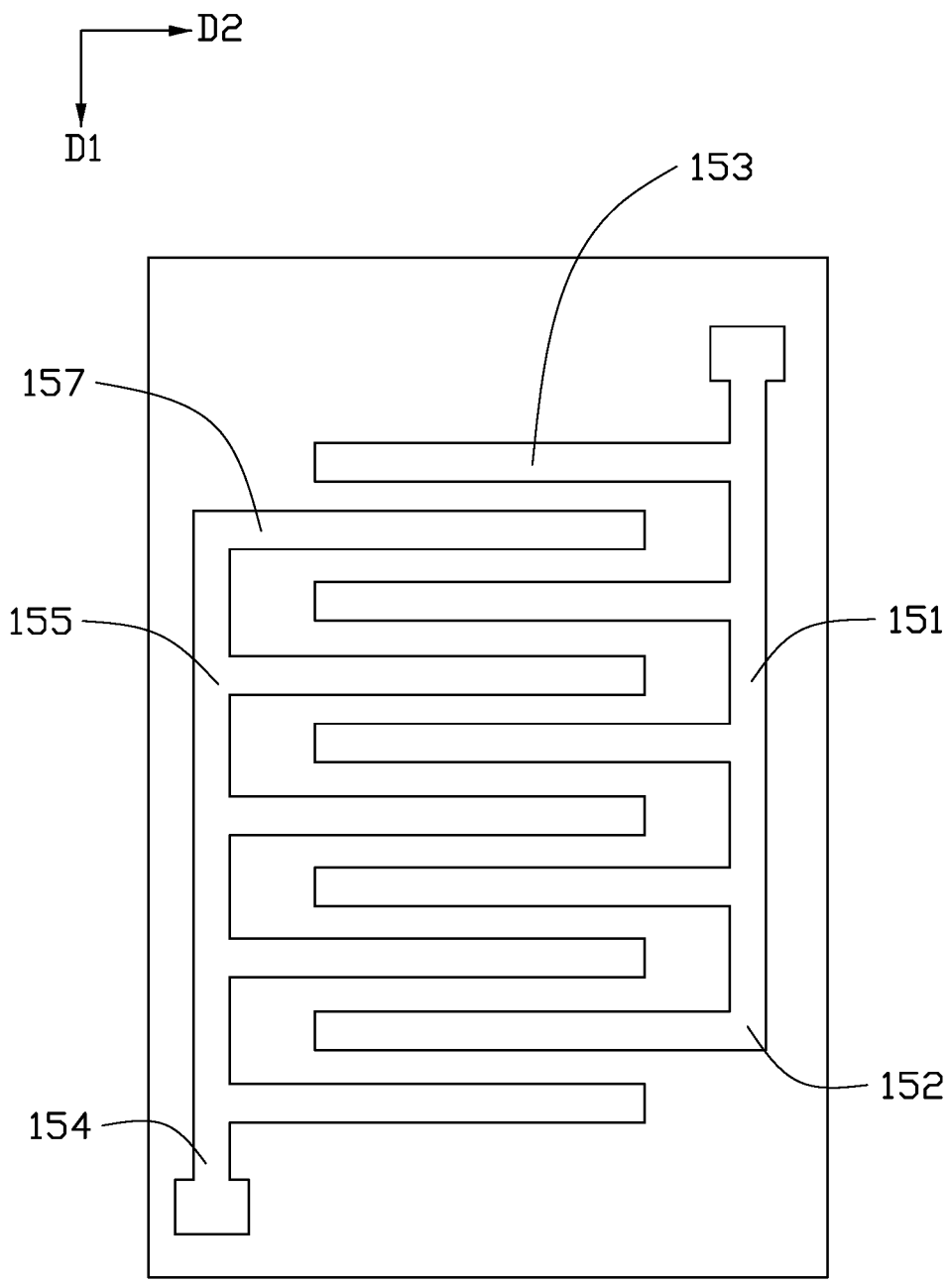
FIG. 2 is a schematic plan view showing two electrodes of a sensing film according to a second embodiment.

FIG. 1 and FIG. 2 show a first embodiment of a sensing film 10. The sensing film 10 includes a base layer 11, a piezoelectric layer 13 formed on the base layer 11, and a first electrode 152 and a second electrode 154 formed on the piezoelectric layer 13 opposite to the base layer 11. An insulating encapsulation layer 17 is formed on the piezoelectric layer 13. The first electrode 152 and the second electrode 154 are disposed in the insulating encapsulation layer 17, and end faces of the first electrode 152 and the second electrode 154 away from the base layer 11 are not covered by the insulating encapsulation layer 17.

As shown in FIG. 2, the first electrode 152 and the second electrode 154 are both comb-shaped structures and are electrically insulated from each other. The first electrode 152 includes a first connecting portion 151 and a plurality of first extending portions 153 extending from the first connecting portion 151. The second electrode 154 includes a second connecting portion 155 and a plurality of second extending portions 157 extending from the second connecting portion 155. The plurality of first extending portions 153 are parallel and spaced apart from each other, and the plurality of second extending portions 157 are parallel and spaced from each other. The first connecting portion 151 and the second connecting portion 155 are substantially rectangular and both extend along a first direction D1 and are spaced from each other. Each of the plurality of first extending portions 153 is substantially rectangular and extends from a same side of the first connecting portion 151 along a second direction D2 toward the second connecting portion 155. The second direction D2 is substantially perpendicular to the first direction D1. Each of the plurality of second extending portions 157 is substantially rectangular and extends from a same side of the second connecting portion 155 toward the first connecting portion 151.

In one embodiment, the first direction D1 is orthogonal to the second direction D2, the first connecting portion 151 is perpendicularly coupled to the first extending portions 153, and the second connecting portion 155 is perpendicularly coupled to the second extending portions 157. The first extending portions 153 of the first electrode 152 and the second extending portions 157 of the second electrode 154 are alternately arranged along the first direction D1.

The base layer 11 is made of an insulating material, such as polyethylene terephthalate (PET).

The piezoelectric layer 13 is made of piezoelectric ceramic. In one embodiment, the piezoelectric layer 13 is a lead zirconate titanate (PZT) ceramic.

The sensing film 10 can be bonded to a printed circuit board. The sensing film 10 has positive piezoelectric and inverse piezoelectric characteristics. Taking the piezoelectric layer 13 made of PZT as an example, the work function of PZT (defined in solid physics as the minimum energy required to move an electron from an interior of the object to a surface of the object) is 4.6 eV. A thin layer of Ag/Al (with a work function of about 4.26 eV) and Mo (with a work function of about 4.6 eV) is used as an ohmic contact improving layer to polarize the PZT, so that the PZE has a piezoelectric effect. When the sensing film 10 is deformed by pressure, electrons are concentrated by an electrode (such as the first electrode 152) to form a current, a piezoelectric driving voltage difference is formed, and a positive piezoelectric characteristic is output, and the sensing film 10 can be utilized as a pressure sensor. In another embodiment, the sensing film 10 utilizes an inverse piezoelectric effect to form an ultrasonic device. Alternatively, by sensing a thickness of the base layer 11 to form a vibration-like film, the sensing film 10 can be used for ultrasonic sensing.

In another embodiment, the piezoelectric layer 13 is made of APbX3. A is selected from one of $CH_3NH_3^+$, $N(CH_3)^{4+}$, and $CH(NH_2)^{2+}$, Pb is positive divalent, and X is a halogen, such as chlorine. (Cl), bromine (Br), or iodine (I). APbX3 has a perovskite structure. In one embodiment, the piezoelectric layer 13 is made of CH3NH3PbI3. Because APbX3 has a band gap that meets an optical band level, it can generate electronic transitions by absorbing visible light to convert light energy into electric energy (photoelectric effect). Therefore, APbX3 materials are widely used in solar cells. At the same time, APbX3 also has a piezoelectric effect having a piezoelectric coefficient d33 of 50-185 pC/N and can be applied in various conventional piezoelectric devices.

Figure 3:
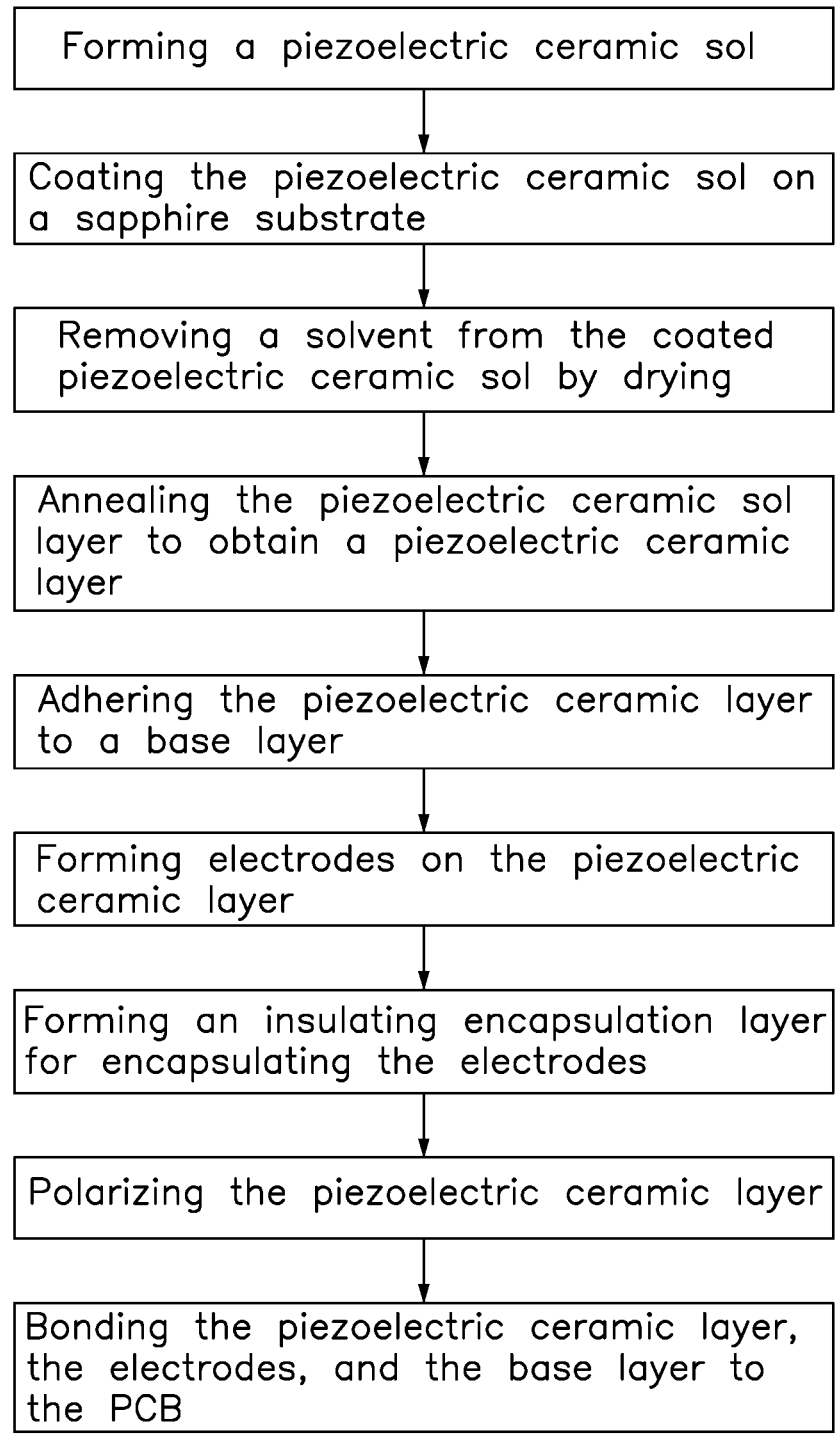
FIG. 3 is a flowchart diagram of a method of preparing the sensing film in FIG. 1.

FIG. 3 shows an embodiment of a method for making the piezoelectric layer 13.

In a first step, a piezoelectric ceramic sol is formed by mixing piezoelectric ceramic powder with a solvent.

In a second step, the piezoelectric ceramic sol is coated on a sapphire substrate. A coating method includes spin coating, brush coating, or the like.

In a third step, the solvent is removed from the coated piezoelectric ceramic sol by drying. In one embodiment, the coated piezoelectric ceramic sol is placed in a 450 degree Celsius reactor. In order to obtain a piezoelectric ceramic layer having a desired thickness, the piezoelectric ceramic sol can be repeatedly coated and dried to obtain a piezoelectric ceramic sol layer having the desired thickness. In one embodiment, the piezoelectric ceramic sol is repeatedly coated and dried twenty times to obtain a thickness of 2 micrometers.

In a fourth step, the piezoelectric ceramic sol layer is annealed to obtain a piezoelectric ceramic layer.

In a fifth step, the piezoelectric ceramic layer is adhered to the base layer (plastic material, such as PET) by a colloid, such as a UV photoresist, and laser-irradiating the piezoelectric ceramic layer and the sapphire substrate to transfer the piezoelectric ceramic layer to the base layer.

In a sixth step, electrodes are formed on the piezoelectric ceramic layer. In one embodiment, the electrodes can be printed on the piezoelectric ceramic layer by screen printing, and then the printed electrodes are etched to form a comb-shaped structure.

In a seventh step, an insulating encapsulation layer is formed for encapsulating the electrodes within the insulating encapsulation layer.

In an eighth step, the piezoelectric ceramic layer is polarized.

In a ninth step, the piezoelectric ceramic layer, the electrodes and the base layer are bonded to the PCB.

Figure 4:
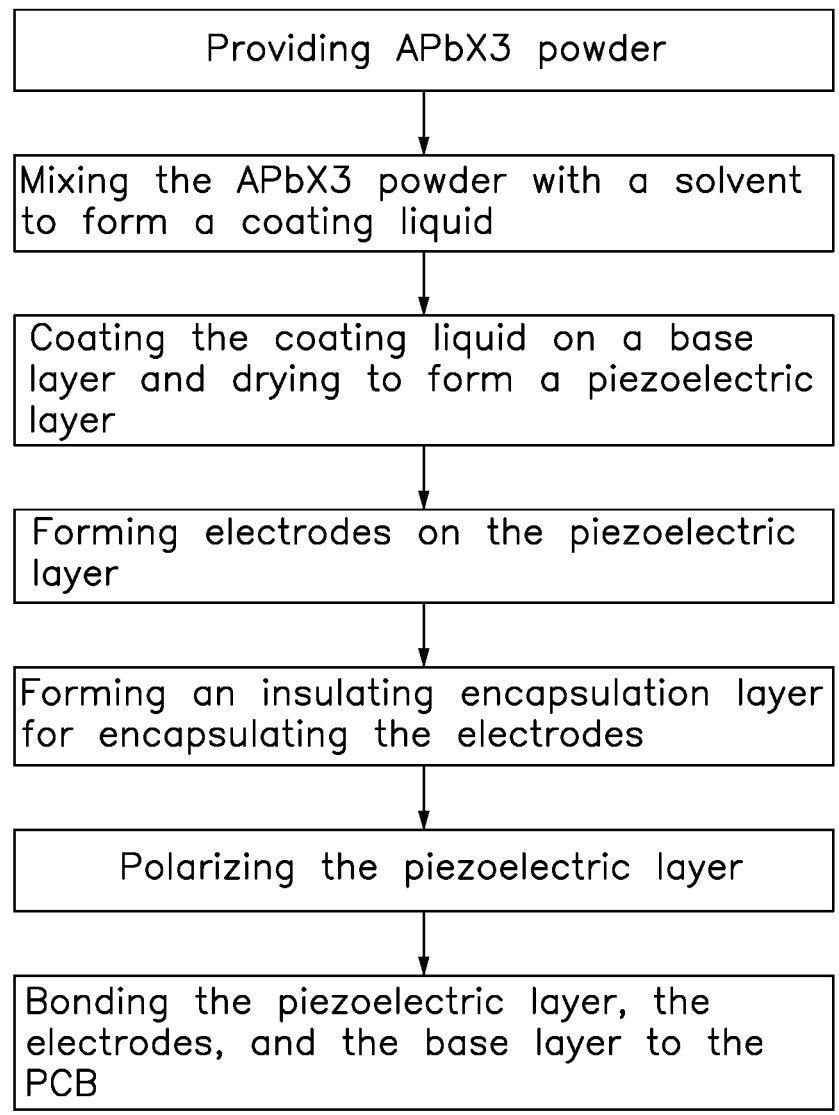
FIG. 4 is a flowchart diagram of another method of preparing the sensing film in FIG. 1.

FIG. 4 shows a method for preparing the sensing film 10 having the piezoelectric layer 13 made of APbX3.

In a first step, APbX3 powder is provided. In one embodiment, $CH_3NH_2$ and HI are mixed to obtain a primary product methylammonium iodide (MAI), and then the MAI is mixed with PbI2 to obtain APbX3.

In a second step, the APbX3 powder is mixed with a solvent to form a coating liquid.

In a third step, the coating liquid is coated on a base layer (such as a plastic material) and dried to form a piezoelectric layer. In one embodiment, the solvent is dimethylformamide (DMF). A coating method may be spin coating, brushing, or the like. The second step may be repeated until the piezoelectric layer reaches the desired thickness.

In a fourth step, electrodes are formed on the piezoelectric layer. In one embodiment, the electrodes can be printed on the piezoelectric layer by screen printing, and then the printed electrodes are etched to form a comb-shape structure.

In a fifth step, an insulating encapsulation layer is formed for encapsulating the electrodes within the insulating encapsulation layer.

In a sixth step, the piezoelectric layer is polarized.

In a seventh step, the piezoelectric layer, the electrodes, and the base layer are bonded to the PCB.

Figure 5:
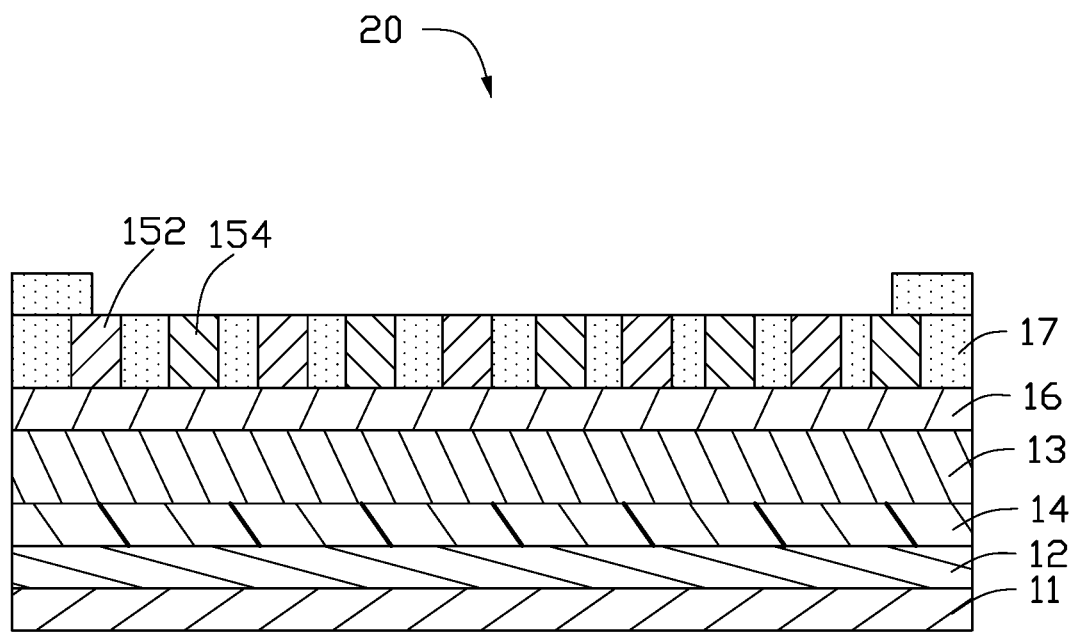
FIG. 5 is a schematic cross-sectional view showing a sensing film according to the second embodiment.

FIG. 5 shows a second embodiment of a sensing film 20. The sensing film 20 includes a base layer 11. A first electrode layer 12 is formed on the base layer 11. An electron transport layer 14 is formed on the first electrode layer 12. A piezoelectric layer 13 is formed on the electron transport layer 14. A hole transport layer 16 is formed on the piezoelectric layer 13. A first electrode 152 and a second electrode 154 are formed on the hole transport layer 16. The first electrode 152 and the second electrode 154 may be similar to the first electrode 152 and the second electrode 154 in FIG. 2. An insulating encapsulation layer 17 is formed on the hole transport layer 16, such that the first electrode 152 and the second electrode 154 are embedded within the insulating encapsulation layer 17 and electrically insulated from each other.

The base layer 11 is made of insulating material such as polyethylene terephthalate (PET). In one embodiment, the first electrode layer 12 is a transparent conductive material, such as indium tin oxide. The electron transport layer 14 is made of zinc oxide. The piezoelectric layer 13 is made of $CH_3NH_3PbI_3$. The hole transport layer 16 is made of a polymer of 3-hexylthiophene (P3HT).

The piezoelectric layer 13 is made of APbX3. A is $CH_3NH_{3+}$, $N(CH_3)^{4+}$ or $CH(NH_2)^{2+}$. Pb is a positive divalent. X is a halogen, such as chlorine (Cl), bromine (Br), or iodine (I). As described above, the piezoelectric layer 13 is made of APbX3, which is capable of converting light energy into electric energy to achieve a photoelectric effect and a piezoelectric effect. Therefore, the sensing film 20 can be applied in a solar cell and can be touched to convert light energy into electric energy.

The sensing film 20 can perform output of the positive and negative electrodes through the first electrode layer 12 and the first electrode 152/second electrode 154. When the sensing film 20 is not pressed, potentials of the first electrode 152 and the second electrode 154 are equal. When the sensing film 20 is deformed by pressing, the potentials of the first electrode 152 and the second electrode 154 are not equal. The voltage-current difference between the first electrode 152 and the second electrode 154 can be converted into a deformation amount to realize a self-powered piezoelectric structure.

When the sensing film 20 is used as a solar panel to convert light energy into electric energy, the electric energy is stored in a capacitor of the PCB board. At this time, the first electrode 152 voltage (VB1)—the first electrode layer 12 voltage (VA)=the second electrode 154 voltage (VB2)—the first electrode layer 12 voltage (VA). If a deformation occurs, a power supply/scanning circuit determines that VB1-VA is not equal to VB2-VA, and the deformation amount can be confirmed by calculation and analysis.

Figure 6:
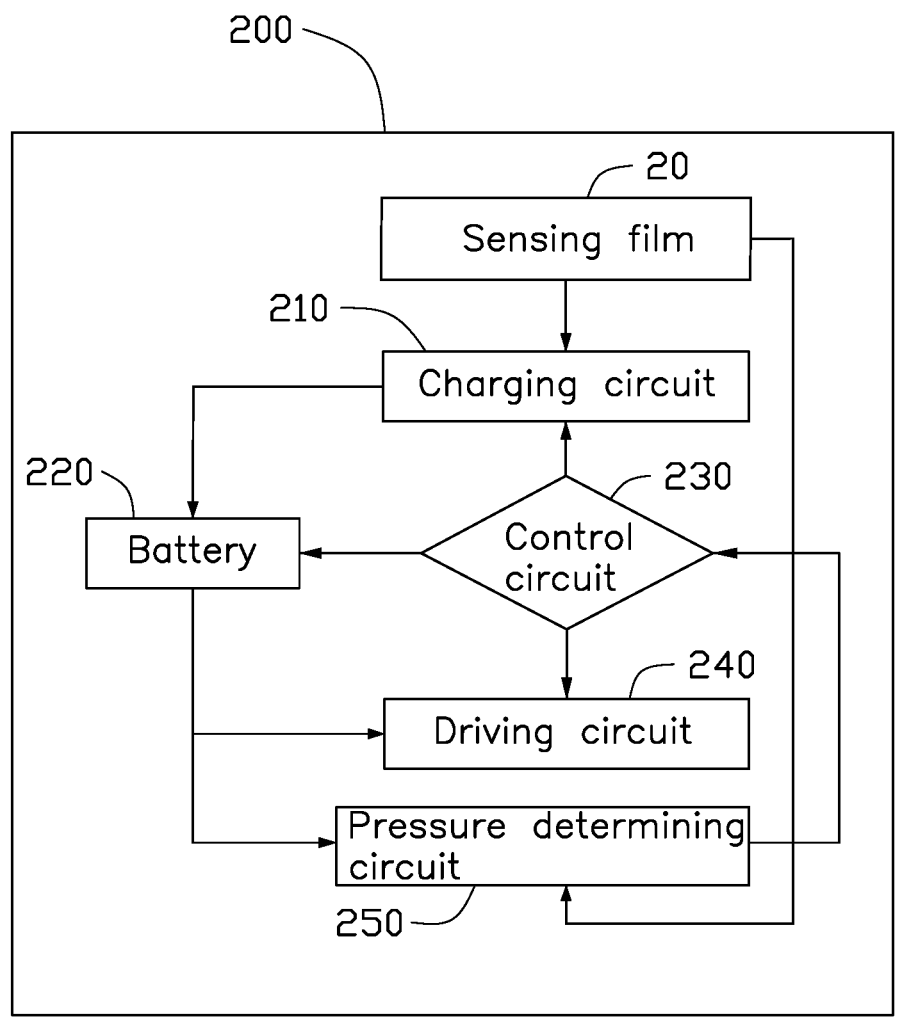
FIG. 6 is a schematic diagram of an electronic device.

FIG. 6 shows an embodiment of an electronic device 200 including the sensing film 20, a charging circuit 210, a battery 220, a control circuit 230, a driving circuit 240, and a pressure determining circuit 250. The sensing film 20 is electrically coupled to the charging circuit 210 to cooperatively convert light energy into electric energy. The charging circuit 210 is electrically coupled to the battery 220 to store the electric energy in the battery 220. The battery 220 is electrically coupled to the driving circuit 240 and the pressure determining circuit 250 to supply power to the driving circuit 240 and the pressure determining circuit 250. The control circuit 230 is electrically coupled to the charging circuit 210, the battery 220, and the driving circuit 240. The sensing film 20 is electrically coupled to the pressure determining circuit 250. The pressure determining circuit 250 determines whether touch deformation has occurred according to an electric current signal change of the sensing film 20. The pressure determining circuit 250 is electrically coupled to the control circuit 230. When it is determined that a touch deformation has occurred, the control circuit 230 controls the charging circuit 210 to activate, thereby exciting a charging function. Therefore, the electronic device 200 including the sensing film 20 is not only capable of sensing touch deformation and being charged by solar power, but also can excite a function of solar charging by deformation. The electronic device 200 can be made to be applied to the surface of a user's skin.

Figure 7:
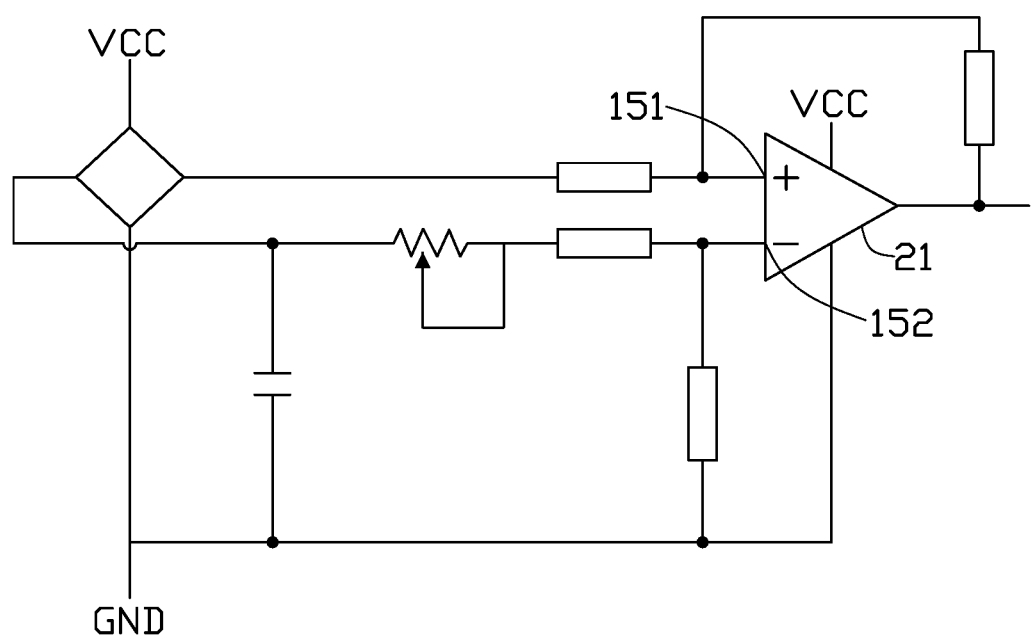
FIG. 7 is a schematic view of a pressure determining circuit of FIG. 6.

As shown in FIG. 7, the pressure determining circuit 250 includes an amplifier 21. A positive input terminal of the amplifier 21 is connected to the first electrode 152, and a negative input terminal of the amplifier 21 is connected to the second electrode 154. When the sensing film 20 is not pressed, a potential of the first electrode 152 is equal to a potential of the second electrode 154, and the amplifier 21 outputs a first signal. When the sensing film 20 is pressed, the potentials of the first electrode 152 and the second electrode 154 are not equal, and the amplifier 21 outputs a second signal different from the first signal (indicating a press). A feedback resistor (not shown) is further electrically connected between the negative input terminal and the output end of the amplifier 21, and the pressure determining circuit 250 further includes other electronic components, such as a fixed resistor (not shown) and a variable resistor (not shown). A capacitor (not shown) or the like is provided to cause the pressure determining circuit 250 to operate normally.

Figure 8:
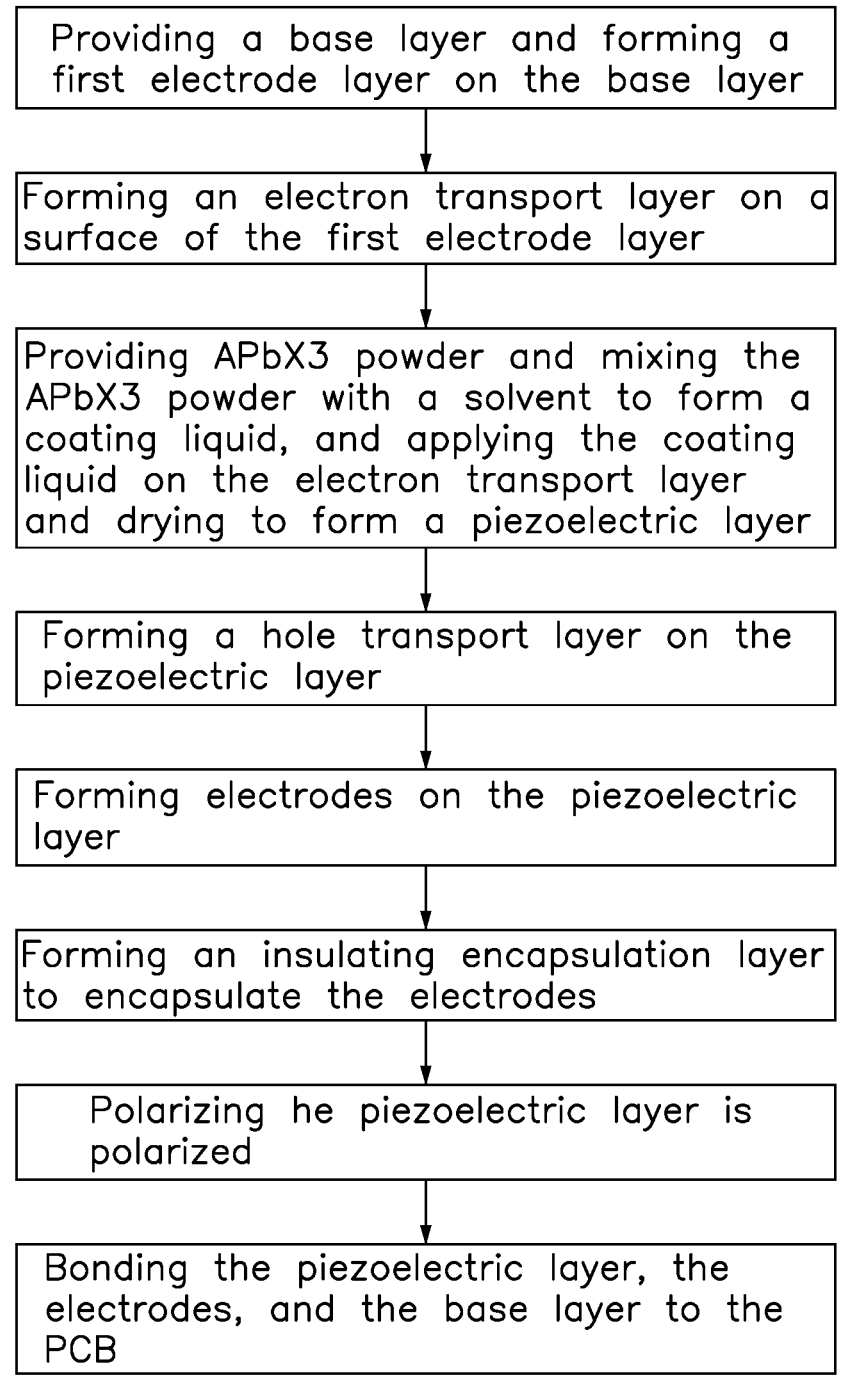
FIG. 8 is a flowchart diagram of a method of preparing the sensing film in FIG. 5.

FIG. 8 shows an embodiment of a method of preparing the sensing film 20.

In a first step, a base layer (plastic material, such as PET) is provided, and a first electrode layer is formed on the base layer. In one embodiment, the first electrode layer is made of transparent conductive material, such as indium tin oxide.

In a second step, an electron transport layer (such as a zinc oxide material) is formed on a surface of the first electrode layer. In one embodiment, a layer of zinc oxide is coated using a coating method such as spin coating or brush coating or deposited using a physical vapor deposition method on the surface of the first electrode layer. The layer of zinc oxide is annealed at a temperature of 120 degrees Celsius.

In a third step, APbX3 powder is provided (the specific preparation steps can be referred to as described above). The APbX3 powder is mixed with a solvent to form a coating liquid, and the coating liquid is applied on the electron transport layer and dried to form a piezoelectric layer. In one embodiment, the solvent is dimethylformamide (DMF), and the coating method is spin coating, brush coating, or the like. The third step is repeated until the thickness of the piezoelectric layer reaches a desired thickness.

In a fourth step, a hole transport layer is formed on the piezoelectric layer. In one embodiment, P3HT is formed on the piezoelectric layer by a coating method such as spin coating or brush coating.

In a fifth step, electrodes are formed on the piezoelectric layer. In one embodiment, the electrodes are printed on the piezoelectric layer by screen printing and then etched to form a comb-shaped structure.

In a sixth step, an insulating encapsulation layer is formed to encapsulate the electrodes. The electrodes are embedded within the insulating encapsulation layer and exposed to the insulating encapsulation layer.

In a seventh step, the piezoelectric layer is polarized.

In an eighth step, the piezoelectric layer, the electrodes, and the base layer are bonded to the PCB.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A sensing film comprising:
    a base layer;
    a first electrode layer formed on the base layer;
    an electron transport layer formed on a surface of the first electrode layer opposite to the base layer;
    a piezoelectric layer formed on a surface of the electron transport layer opposite to the base layer;
    a hole transport layer formed on a surface of the piezoelectric layer opposite to the base layer; and
    a first electrode and a second electrode each formed on a surface of the hole transport layer; wherein:
    the first electrode and the second electrode are spaced apart and electrically insulated from each other;
    the piezoelectric layer is made of APbX3, wherein A is $CH_3NH_3^+$, $N(CH_3)_4^+$, or $CH(NH_2)_2^+$;
    X is a halogen; and
    APbX3 is a perovskite structure.

2. The sensing film of claim 1, wherein:
    the first electrode comprises a first connecting portion and a plurality of first extending portions, each of the plurality of first extending portions being coupled to the first connecting portion;
    the second electrode comprises a second connecting portion and a plurality of second extending portions, each of the plurality of second extending portions being coupled to the second connecting portion;
    the first connecting portion and the second connecting portion are spaced apart and face each other;

each of the plurality of first extending portions extends from a side of the first connecting portion toward the second connecting portion;

each of the plurality of second extending portions extends from a side of the second connecting portion toward the first connecting portion; and the plurality of first extending portions and the plurality of second extending portions are alternately arranged on the hole transport layer.

3. The sensing film of claim 1 further comprising an insulating encapsulation layer formed on a surface of the hole transport layer, wherein:

the first electrode and the second electrode are disposed in the insulating encapsulation layer;

the first electrode and the second electrode are spaced apart and electrically insulated from each other by the insulating encapsulation layer; and end faces of the first electrode and the second electrode away from the base layer are not covered by the insulating encapsulation layer.

4. The sensing film of claim 1, wherein the first electrode layer is made of indium tin oxide.

5. The sensing film of claim 1, wherein the base layer is made of polyethylene terephthalate (PET).

6. The sensing film of claim 1, wherein the electron transport layer is made of zinc oxide.

7. The sensing film of claim 1, wherein the hole transport layer is made of a polymer of 3-hexylthiophene (P3HT).

* * * * *